United States Patent [19]

Leeke

[11] Patent Number: 5,913,051

[45] Date of Patent: Jun. 15, 1999

[54] METHOD OF SIMULTANEOUS SIMULATION OF A COMPLEX SYSTEM COMPRISED OF OBJECTS HAVING STRUCTURE STATE AND PARAMETER INFORMATION

[75] Inventor: Steven D. Leeke, Plano, Tex.

[73] Assignee: Texas Instruments Incorporated, Dallas, Tex.

[21] Appl. No.: 07/958,615

[22] Filed: Oct. 9, 1992

[51] Int. Cl.$^6$ ..................................................... G06F 9/455
[52] U.S. Cl. ............................................................ 395/500
[58] Field of Search ..................... 364/DIG. 1 MS File, 364/DIG. 2 MS File, 149, 150, 151, 152, 153, 154, 155, 156, 158, 159, 550, 578; 395/375, 500, 325, 600, 775, 800

[56] References Cited

U.S. PATENT DOCUMENTS 4,796,194  1/1989  Atherton ................................. 364/578

Primary Examiner—Robert B. Harrell

Attorney, Agent, or Firm—Tammy L. Williams; Jay M. Cantor; Richard L. Donaldson

[57] ABSTRACT

Simulation of a complex system begins by generating a plurality of system objects (12) describing items within the system through structural information within the system object (12). Each system object (12) corresponds to a plurality of parameter group objects (18, 20, 22), and a plurality of state objects (24, 26, 28) associated therewith. Each system object (12) also corresponds to a plurality of simulation objects (30, 32, 34) representing specific simulations of the complex system. Each simulation object (30) associates with a parameter group object (18) and a state object (24). Each object is indexed by an object identifier (OID) and parameter group and state objects are further indexed by their corresponding simulation object identifier. Structural, parameter, and state information are separated within their own individual objects allowing multiple threads of system configuration to be run through the simulation objects simultaneously for parallel comparison of simulation results.

19 Claims, 2 Drawing Sheets

METHOD OF SIMULTANEOUS SIMULATION OF A COMPLEX SYSTEM COMPRISED OF OBJECTS HAVING STRUCTURE STATE AND PARAMETER INFORMATION

TECHNICAL FIELD OF THE INVENTION

This invention relates in general to manufacturing processes and more particularly to a method of simulating operation of a complex system.

BACKGROUND OF THE INVENTION

Simulation techniques provide a manner in which a complex system can be modeled in order to compare results from running the model with actual results observed from the complex system. An example of a complex system is a distributed manufacturing plant capable of fabricating a variety of products through ordered sequences of process steps. Distributed factories consist of heterogeneous, unconnected work stations capable of adapting to a varying product mix but resulting in complexity of operations, management, and quality control. Distributed factories are common in the manufacture of modern electronics products. Various types of distributed factories can be involved in the manufacture of modern electronics products such as wafer slicing, wafer fabrication, semiconductor component assembly, circuit board fabrication, circuit board assembly, and electronic product assembly.

The typical example of a distributed factory is a wafer fabrication plant which may manufacture products simultaneously according to over 1,000 processes, each averaging over 100 steps. Such a large number of processes is difficult to represent in a fabrication graph but can be described in a computer system. However, discrete event computer simulation of a wafer fabrication plant is a complicated process. A very large number of parameters exist, usually well over 10,000 parameters, that can be changed in the simulation model to effect its behavior. As a result, simulation as an analysis technique is difficult and time consuming to use effectively. The natural outcome in such a situation is that simulation is either not used, or worse yet, it is used incorrectly. In many cases, too few simulations are run to arrive at statistically valid results.

Existing simulation languages and systems, such as SLAM, SIMSCRIPT, SIMON, and GPSS, implicitly combine state and structure information allowing only a single thread of control, i.e. simulation, to be active at any one time. Though most simulation software can run on multiple processors, simulations can only be run in serial fashion. In most cases, the data from each simulation is stored externally from the simulation model representation, thus making it difficult to have a detailed comparison of simulation results. Therefore, it is desirable to simulate a distributed factory by separating state and structure information to allow for multiple threads of control and simulations to be run simultaneously for parallel comparative analysis.

From the foregoing, it may be appreciated that a need has arisen for a method of simulating a complex system that separates state and structure information and allows for multiple simulation runs to occur in parallel to speed the completion of statistically significant experimental results. Further, a need has arisen for a method of simulating a complex system that allows for comparison of simulation results through indexing of state, structure, and parameter information.

SUMMARY OF THE INVENTION

In accordance with the present invention, a method of simulating a complex system is provided which substantially eliminates or reduces disadvantages and problems associated with prior simulation techniques.

The present invention includes the step of defining the complex system as a plurality of objects. Structure, state, and parameter information are distributed into separate objects defining the complex system. Simultaneous simulations of the complex system occur in multiple threads of system configurations established through the plurality of objects. Further, each object has a unique identifier for indexing purposes to allow easy access for changes in system configurations among different simulations and control of comparative analysis of the simulations.

The present invention provides various technical advantages over other simulation techniques within the prior art. One technical advantage is in having a simulation technique which has separate state, structure, and parameter information representations. Another technical advantage is in forming multiple threads of control for parallel processing of simulation runs. Yet another technical advantage is in indexing the information representations to allow easy access to complex system information and provide effective comparative analysis of simulation results. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
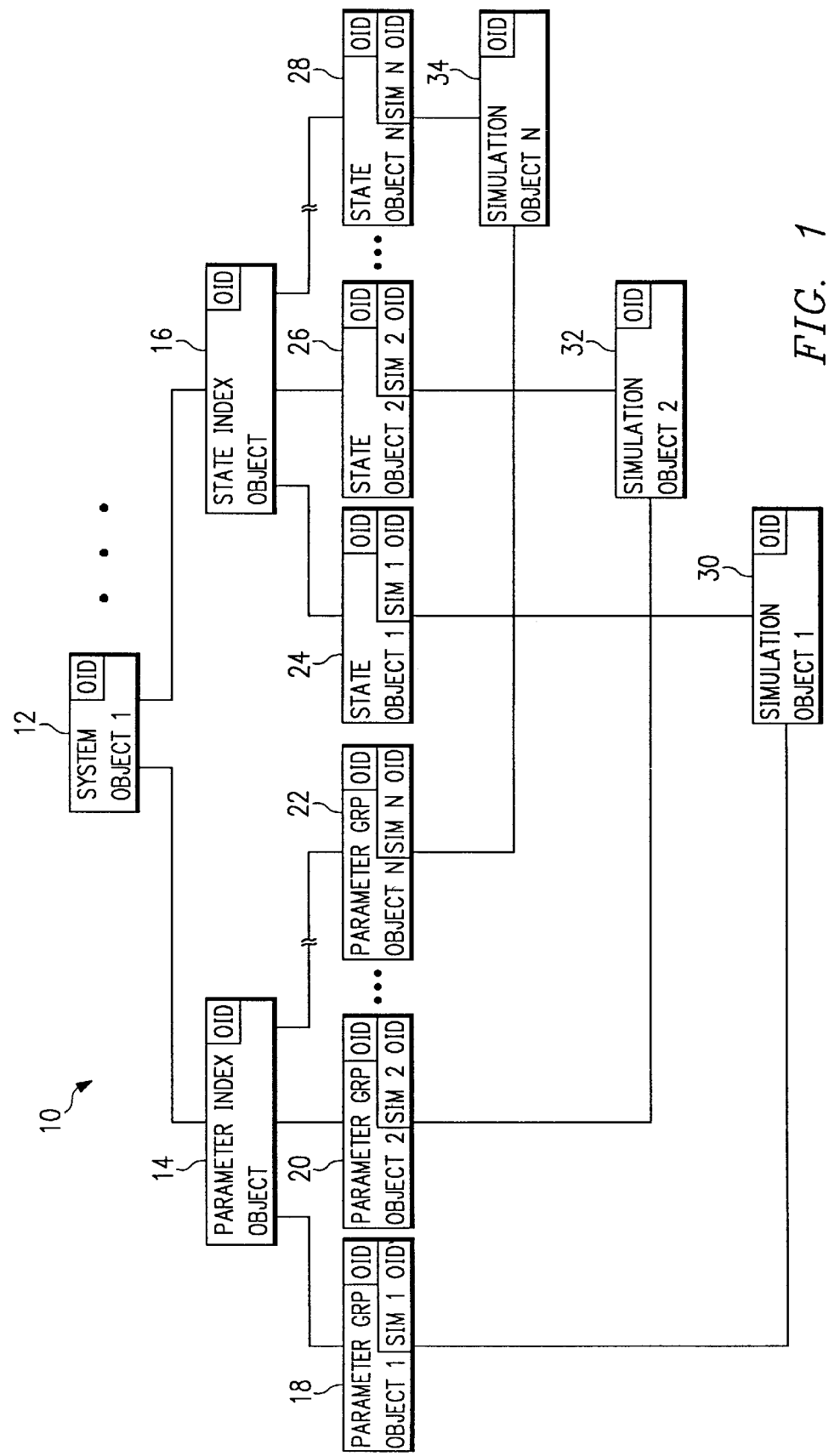
FIG. 1 is a block diagram of a representation of a complex system in accordance with the present invention.

FIG. 1 illustrates a block diagram of an object oriented representation 10 of a complex system according to the present invention. System object 1 block 12 is a representation of an actual item within the complex system. Other system object blocks, not shown, correspond to other items within the complex system. Using a wafer fabrication factory as an example of a complex system, system object 12 may represent a machine within the factory. System object 1 block 12 is separated into a parameter index object block 14 and state index object block 16. Parameter index object block 14 is further separated into parameter group object 1 block 18, parameter group object 2 block 20, and so on up to parameter group object N block 22. State index object block 16 further separates into state object 1 block 24, state object 2 block 26, and so on up to state object N block 28. Each and every parameter group object block and state object block ties to a corresponding simulation object block such that parameter group object 1 block 18 and state object 1 block 24 corresponds to simulation object 1 block 30, parameter group object 2 block 20 and state object 2 block 26 corresponds to simulation object 2 block 32, and ending with parameter group object N block 22 and state object N block 28 corresponding to simulation object N block 34.

Figure 2:
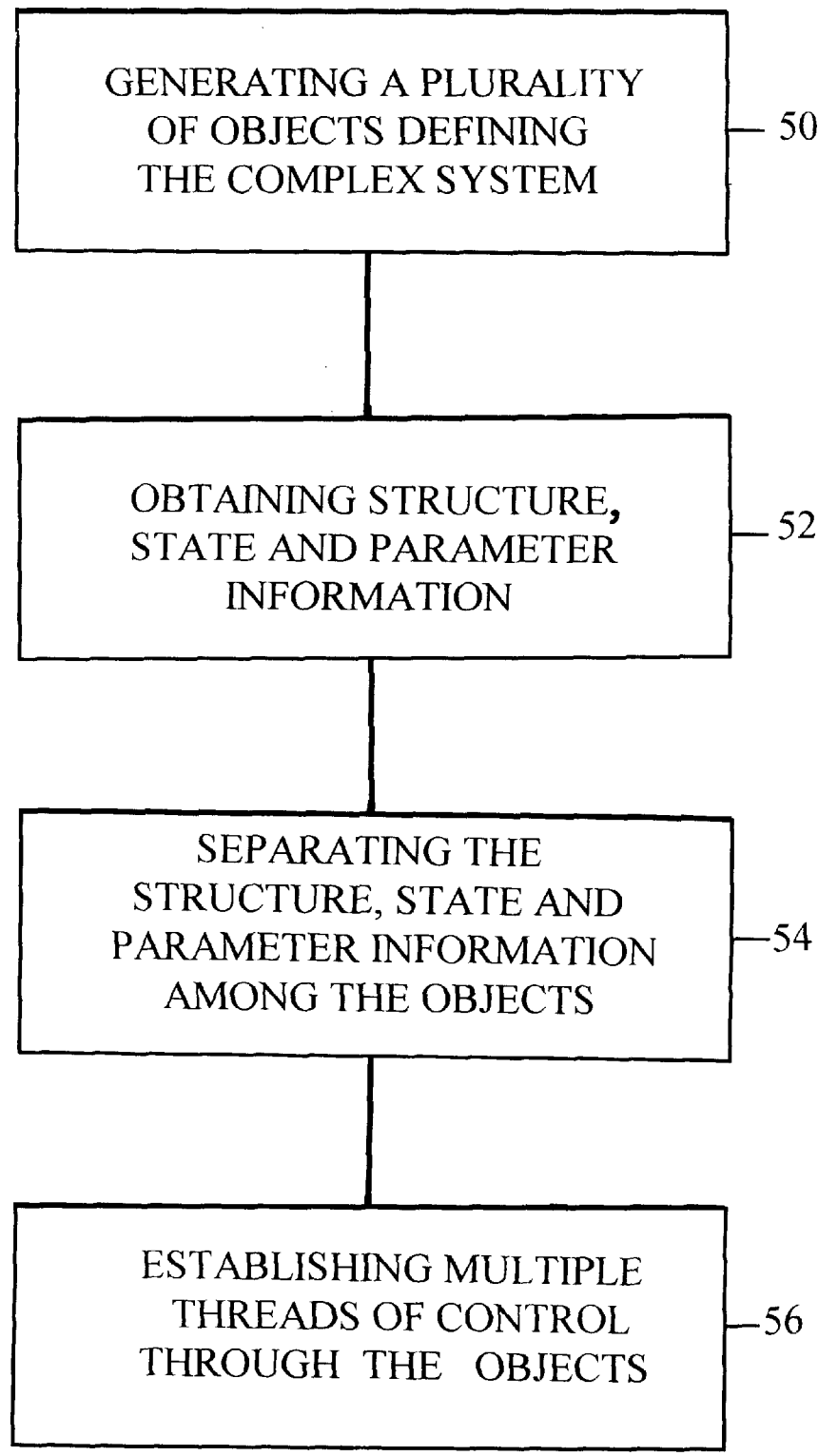
FIG. 2 is a flow diagram illustrating the present invention.

FIG. 2 shows a flowchart illustrating operation of the present invention.

According to the present invention, as shown in FIG. 2, a complex system such as a wafer fabrication factory is viewed as a set of objects and their relationships as shown at block 50. Each item in the complex system is broken into a main structural representation object and collections of objects representing complete state and parametric information for the item. The objects representing the complex system are divided to allow access to each of them individually. Individual access to objects occurs by establishing an object identifier (OID) for each object. In this manner, an index is created for locating state and parametric information distributed throughout the system as a whole.

System object 1 block 12 contains structural information of an actual item within the complex system, for example the machine within the wafer fabrication factory. Placing structural data within system object 1 block 12 and establishing corresponding objects for state and parametric information achieves the goal of having separate structural, state, and parametric information representations in the system object. Parameter group object blocks 18, 20, and 22 specify values for each numeric element of the system object that may be varied and establish a particular configuration of system object 1 block 12. These values may be fixed, sampled from a random distribution, or one of a set of values that are used in round robin fashion throughout the simulation. Each parameter group object comprises parameter objects, not shown, necessary to define a configuration of system object 1 block 12 for a specific simulation. State object blocks 24, 26, and 28 specify variables for different operating states of the system object. Structure, state, and parameter information is obtained by interfacing with the complex system as shown at block 52. The structure, state and parameter information is then separated among the objects which make up the complex system as shown at block 54. In the present invention, the simulations themselves are objects. Each simulation object block 30, 32, and 34 includes the definition of a period for a simulation, a collection of events associated with the simulation, and high level data collected on the complex system during the simulation.

Each system object, parameter group object, and state object representing the complex system have their own object identifier (OID). In memory only based systems, the OID may be a standard memory pointer. In complex or distributed object oriented systems, brokered persistent object storage performs the OID function. Object relationships are represented using persistent pointers with semantic information. Semantic information allows the object relationships to have a one to one, one to N, N to N, or N to M ratio as well as to indicate location and whether create on write functions or copy on write functions should be invoked to modify the object to which it points. The OID comprises a class ID, the time stamp of creation, and a serial number. Additional OID information may consist of a process ID and a machine ID representing an ethernet address.

Each parameter group object block 18, 20, and 22 and each state object block 24, 26, and 28 have an additional identifier SIM 1 OID, SIN 2 OID, and SIM N OID, respectively, corresponding to each simulation object identifier of simulation object blocks 30, 32, and 34. The simulation object identifier is used to index distributed state and parametric information throughout the system. Thus, for any given simulation object, all state information may be found by locating all state data for each simulation and each object and likewise for all parameter information. Each simulation object block 30, 32, and 34 represents a specific thread of control that allows for multiple simulation replications as shown at block 56 each having its own parameter and state values that can be run in parallel to speed the completion of statistically significant experimental results. Distinct and different parameter and state information may be established for each thread of control represented by simulation object blocks 30, 32, and 34 allowing for system changes between threads of control to support experimentation.

An experiment represents a collection of related simulations. Each simulation object block 30, 32, and 34 represents a different simulation as established by the state object and the parameter group object corresponding to each simulation object. The relationship between simulations may be defined by a researcher through changes to parameter and state information for each simulation object or automatically generated. The ability to have multiple threads of system configuration allows for experimentation and comparative analysis of the complex system. Through parallel comparison of simulation results, unproductive threads of system configuration may be terminated without having to alter system configuration and reinitiate a simulation run.

Attached hereto and forming a part of this specification is an Appendix A, herein incorporated by reference in it's entirety, comprising a source code listing written in Object C language illustrating an example of a system object, a state object, a parameter object, simulation object, and a persistent OID according to the present invention.

In summary, a simulation technique is shown that relies on object oriented representation of information. State, parametric, and structural information are separate from each other and state and parametric information are indexed for each simulation run. Unique configurations and analyses of the basic structure model of a complex system, as represented by discrete changes in parameter and state information between each simulation object, identifies unique threads of control in the model. Multiple simulations can be run simultaneously through distinct simulation objects.

Thus, it is apparent that there has been provided in accordance with the present invention, a method for simulating a complex system that satisfies the advantages set forth above. Although the preferred embodiment has been described in detail, it should be understood that various changes, substitutions, and alterations can be made herein. For example, though the present invention has been described in connection with a wafer fabrication factory, the present invention may be implemented for a variety of other complex systems. Other examples are readily ascertainable by one skilled in the art and could be made without departing from the spirit and scope of the present invention as defined by the following claims.

APPENDIX A

1. Persistent OID

```
typedef struct _tagType {
    /*
        Serial number only has to be unique to within
        the time resolution.
    */
    long    serialNum;
    INT     idNum;
    /*
        This should really be in GMT to have
        models be transportable across timezone.
    */
    long    time;
    /*
        For multi-user/multi-machine (distributed) OID's.
    */
    long    machineID;
    INT     processID;
```

APPENDIX A-continued

```
} tagtype;
typedef struct _simpleRefType {
    tagType    tag;
    struct {
        INT referenceOnly  :  1;
        INT createOnAccess :  1;
        INT copyOnWrite    :  1;
    } flags;
    struct _coreType *prt;
} simpleRefType;
```

2. Simulation object

```
class_simulationType : baseType {
    /*
        Simulations generate different WIP and data.
        => the WIP and data must be indexed by
    simulation.
    */
    /*
        Simulation instance specific slots.
    */
    INT                  animatePattern;
    undesigned INT       delayBetEvents;
    windowRefType        simInfoWindow;
    windowRefType        traceExecWindow;
    windowRefType        traceSchedWindow;
    FILE                 *traceFile;
    dateTimeType         startDateTime;
    dateTimeType         endDateTime;
    simpleRefType        eventCalendar;
    INT                  interceptCnt;
};
class experimentType : baseType {
    INT                  noOfMultSims;
    INT                  simCnt;
    Boolean              NewSeeds;
    simpleRefType        seedGen;
    /*
        The set of simulations to run.
    */
    simpleRefType        simulations;
};
```

3. System object

```
class machineType : equipmentType
    simpleRefType        last InitProcess;
    /*
            Overrides slots
    */
    machineSpecOverrideType overrides;
};
class machineSpecType : equipmentSpecType {
    /*
        Override slots
    */
    machineSpecOverrideType    overrides;
    struct {
        simpleRefType    fixedTime;
        simpleRefType    variableTime;
    } load;
    struct {
        simpleRefType    fixedTime;
        simpleRefType    variableTime;
    } unload;
    struct {
        struct {
            simpleRefType    fixedTime;
            simpleRefType    variableTime;
        } setup;
        struct {
            simpleRefType    fixedTime;
            simpleRefType    variableTime;
        } setdown;
    } standard;
    /*
        Simulations generate different WIP and data.
        =>the WIP and data must be indexed by simulation.
    */
};
```

```
struct typedef _machineSpecOverrideType {
    /*
        Override slots
    */
    simpleRefType    unitProcesses;
    simpleRefType    defaultUnitProcess;
    simpleRefType    upstreamDiscipline;
    struct {
        struct {
            simpleRefType    fixedTime;
            simpleRefType    variableTime;
        } setup;
        struct {
            simpleRefType    fixedTime;
            simpleRefType    variableTime;
        } setdown;
    } conditional;
} machineSpecOverrideType;
class equipmentType : referenceType {
    /*
        Override slots.
    */
    /*
        Local data.
    */
    dateTimeType            purchaseDate;
    /*
        Simulations generate different WIP and data.
        =>the WIP and data must be indexed by simulation.
        Data objects Group indexed by simulation.
    */
    simpleRefType           data;
};
class equipmentSpecType : baseType {
    /*
        Override slots
    */
    equipmentSpecOverrideType    overrides;
    FLOAT                        capitalCost;
    INT                          depreciationPeriod;
};
typedef struct _equipmentSpecOverrideType {
    /*
        Override slots.
    */
    /*
        Unscheduled Interrupts. (FAILURES)
        Only occur during processing.
    */
    simpleRefType           interrupts;
    disciplineActionType    repair;
    /*
        Unscheduled assists.
        Only occur during processing.
    */
    simpleRefType           assists;
    /*
        Scheduled availability.
    */
    simpleRefType           availability;
    /*
        Scheduled interrupts. (PM)
        Only occur during idle/down.
    */
    simpleRefType           maintenance;
} equipmentSpecOverrideType;
```

4. State Object

```
class machineDataType : equipmentDataType {
    numericType         batchSize;
    numericType         setupTime;
    numericType         setdownTime;
    numericType         cycleTime;
    numericType         processTime;
    numericType         queueTime;
    /*
        Simulations generate different WIP and data.
        =>the WIP and data must be indexed by simulation.
    */
};
```

APPENDIX A-continued

```
class equipmentDataType : baseType {
    unsigned INT        state;
    simpleRefType       inResidence;
    simpleRefType       inProcess;
    simpleRefType       inTransitTo;
    simpleRefType       queue;
    simpleRefType       activeInterrupts;
    linkedListType      pendingEvents;
    linkedListType      pastEvents;
    numericType         downTime;
    numericType         repairTime;
    numericType         interruptInterval;
    FLOAT               availability;
    /*
        Simulations generate different WIP and data.
        =>the WIP and data must be indexed by simulation.
    */
};
5. Parameter Object class paramType : baseType {
    INT                 valueKind;
    union {
        INT                 integer
        FLOAT               real;
        Boolean             boolean;
        dateTimeType        dateTime;
    } value;
    INT                 units;
    simpleRefType       gen;
    setType             set;
    numericType         samples;
};
class genType : baseType {
    unsigned long       seed;
    unsigned long       randVal;
    unsigned long       lastRand;
    unsigned long       roundTable[RndShuffleSize];
    numericType         uniformSamples;
    distribType         distrib;
    numericType         distribSamples;
    tabularType         tabularDistrib;
};
```

What is claimed is:

1. A method of simulating operation of a complex system, comprising steps of:
   generating a plurality of objects to define the complex system, each of said plurality of objects representing an actual item within the complex system;
   interfacing with the complex system to obtain structure information, state information, and parameter information for the complex system in response to said generating step;
   separating said structure information, said state information, and said parameter information among said plurality of objects in response to said interfacing step; and
   establishing multiple threads of control through said plurality of objects in response to said separating step.

2. The method of claim 1, wherein said separating step further includes a step of defining a plurality of system objects within said plurality of objects, each of said plurality of system objects including said structure information corresponding to said actual item within the complex system.

3. The method of claim 2, wherein said separating step further includes a step of associating a plurality of state objects with said each of said plurality of system objects, each of said plurality of state objects including said state information for a specific state of said each of said plurality of system objects.

4. The method of claim 3, wherein said separating step further includes a step of associating a plurality of parameter group objects with said each of said plurality of system objects, each of said plurality of parameter group objects including said parameter information for numeric elements of said each of said plurality of system objects.

5. The method of claim 4, wherein said separating step further includes a step of associating with said each of said plurality of system objects a plurality of simulation objects, wherein each of said plurality of simulation objects represents a simulation of the complex system and a unique thread of a configuration of the complex system, said unique thread of said configuration of the complex system being defined by one of said plurality of state objects and one of said plurality of parameter group objects associated with said each of said plurality of system objects.

6. The method of claim 5, further comprising steps of:
   identifying said each of said plurality of system objects with a unique system object identifier;
   identifying said each of said plurality of state objects with a unique state object identifier;
   identifying said each of said plurality of parameter group objects with a unique parameter group object identifier; and
   identifying said each of said plurality of simulation objects with a unique simulation object identifier.

7. The method of claim 6, further comprising steps of:
   indexing said each of said plurality of system objects by said unique system object identifier;
   indexing said each of said plurality of state objects by said unique state object identifier;
   indexing said each of said plurality of parameter group objects by said unique parameter group object identifier; and
   indexing said each of said plurality of simulation objects by said unique simulation object identifier.

8. The method of claim 7, further comprising a step of:
   indexing said one of said plurality of state objects and said one of said plurality of parameter group objects by said unique simulation object identifier of said each of said plurality of simulation objects associated therewith.

9. The method of claim 8, further comprising steps of:
   accessing said each of said plurality of system objects through said unique system object identifier associated therewith to control said structure information within said each of said plurality of system objects;
   accessing said each of said plurality of state objects through said unique state object identifier associated therewith to control said state information within said each of said plurality of state objects; and
   accessing each of said plurality of parameter group objects through said unique parameter group object identifier associated therewith to control said parameter information within said each of said plurality of parameter group objects.

10. The method of claim 9, further comprising a step of:
    simultaneously executing simulations through said each of said plurality of simulation objects.

11. The method of claim 10, further comprising a step of:
    comparing said simulations executed through said each of said plurality of simulation objects.

12. The method of claim 11, further comprising a step of:
    terminating said unique thread of said configuration of the complex system in response to said comparing step.

13. A method of simulating operation of a complex system, comprising steps of:

generating a plurality of system objects, each of said plurality of system objects comprises structure information corresponding to actual items within the complex system;

generating a plurality of state objects, each of said plurality of state objects corresponds with one of said plurality of system objects and said each of said plurality of state objects comprises state information for a specific state of said one of said plurality of system objects;

generating a plurality of parameter group objects, each of said plurality of parameter group objects corresponds with said one of said plurality of system objects and said each of said plurality of parameter group objects comprises parameter information for elements of said one of said plurality of system objects; and generating a plurality of simulation objects, each of said plurality of simulation objects corresponds to said one of said plurality of system objects, said each of said plurality of simulation objects represents a simulation of the complex system and a unique thread of a configuration of the complex system, said each of said plurality of simulation objects associated with one of said plurality of state objects and one of said plurality of parameter group objects, said unique thread of said configuration of the complex system defined by said one of said plurality of state objects and said one of said plurality of parameter group objects.

14. The method of claim 13, further comprising steps of:

indexing said each of said plurality of system objects by a unique system object identifier;

indexing said each of said plurality of state objects by a unique state object identifier;

indexing said each of said plurality of parameter group objects by a unique parameter group object identifier; and indexing said each of said plurality of simulation objects by a unique simulation object identifier.

15. The method of claim 14, further comprising a step of:

indexing said one of said plurality of state objects and said one of said plurality of parameter group objects by said unique simulation object identifier of said each of said plurality of simulation objects associated therewith.

16. The method of claim 15, further comprising steps of:

accessing said each of said plurality of system objects by said unique system object identifier associated therewith to control said structure information within said each of said plurality of system objects;

accessing said each of said plurality of state objects by said unique state object identifier associated therewith to control said state information within said each of said plurality of state objects;

accessing said each of said plurality of parameter group objects by said unique parameter group object identifier associated therewith to control said parameter information within each of said plurality of parameter group objects; and accessing said each of said plurality of simulation objects by said unique simulation object identifiers associated therewith to control said structure information, said state information and said parameter information within said each of said plurality of simulation objects.

17. The method of claim 16, further comprising a step of:

simultaneously executing simulations through said each of said plurality of simulation objects.

18. The method of claim 17, further comprising a step of:

comparing said simulations executed through said each of said plurality of simulation objects.

19. The method of claim 18, further comprising a step of:

terminating said unique thread of said configuration of the complex system in response to said comparing step.

* * * * *